(12) United States Patent
Levinson et al.

(10) Patent No.: US 6,836,228 B1
(45) Date of Patent: Dec. 28, 2004

(54) ANALOG-TO-DIGITAL CONVERTER WITH SWITCHED INTEGRATOR

(75) Inventors: Roger Levinson, Sunnyvale, CA (US); Phillip J. Benzel, Pleasanton, CA (US)

(73) Assignee: Xicor, Inc., Milpitas, CA (US)

( * ) Notice: Subject to any disclaimer, the term of this patent is extended or adjusted under 35 U.S.C. 154(b) by 54 days.

(21) Appl. No.: 10/301,129

(22) Filed: Nov. 20, 2002

(51) Int. Cl.$^7$ .............................................. H03M 1/00
(52) U.S. Cl. ...................................... 341/136; 341/143
(58) Field of Search ................................. 341/136, 143, 341/155

(56) References Cited

U.S. PATENT DOCUMENTS

| | | | | |
|---|---|---|---|---|
| 4,789,862 A | * | 12/1988 | Jackson | 341/155 |
| 5,461,381 A | * | 10/1995 | Seaberg | 341/143 |
| 5,870,048 A | * | 2/1999 | Kuo et al. | 341/143 |
| 6,369,730 B1 | | 4/2002 | Blanken et al. | |

OTHER PUBLICATIONS

Tan, Nianxiong and Sven Eriksson, "A Low Voltage Switched–Current Delta–Sigma Modulator," IEEE Journal of Solid–State Circutis, vol. 30, No. 5, May 1995, pp. 599–603.

Cherry, James A. and W. Martin Snelgrove, "Excess Loop Delay in Continuous–Time Delta–Sigma Modulators," IEEE Transactions on Circuits and Systems–II: Analog and Digital Signal Processing, vol. 46, No. 4, Apr. 1999, pp. 376–389.

Cherry, James A. and W. Martin Snelgrove, "Clock Jitter and Quantizer Metastability in Continuous–Time Delta–Sigma Modulators," IEEE Transactions on Circuits and Systems–II: Analog and Digital Signal Processing, vol. 46, No. 6, Jun. 1999, pp. 661–676.

* cited by examiner

*Primary Examiner*—Brian Young
*Assistant Examiner*—Joseph Lauture
(74) *Attorney, Agent, or Firm*—Townsend and Townsend and Crew LLP; J. Matthew Zignant

(57) ABSTRACT

Methods and apparatus for converting analog signals to digital signals using a switched integrator. A method includes receiving the analog signal at a summing junction, receiving a clock signal transitioning between a first level and a second level, connecting an output of the summing junction to an integrator when the clock signal is at the first level, and disconnecting the output of the summing junction from the integrator when the clock signal is at the second level. An output signal is provided, and is determined by the polarity of an output of the integrator when the clock signal transitions from the first level to the second level. The output signal is delayed, and received with a digital-to-analog converter; which provides an output to the summing junction.

32 Claims, 8 Drawing Sheets

ANALOG-TO-DIGITAL CONVERTER WITH SWITCHED INTEGRATOR

BACKGROUND OF THE INVENTION

Sigma-delta converters have become increasingly popular the last two decades. They are particularly useful in high-resolution, low-bandwidth applications, such as speech, audio, test, and measurement. Other types of converters, such as successive approximation, pipeline, and flash, are typically used in lower-resolution applications.

The marketplace for sigma-delta converters is growing exponentially, fueled by the availability of low cost digital-signal processing circuits. Unfortunately, limitations of current converter architectures mean that costly, high-power, low-performance switched-capacitor filters are used. Embodiments of the present invention allows the use of low-cost, low-power, continuous-time filters that enable sigma-delta converters to be used in a wider array of products and applications than is otherwise possible today.

FIG. 1 is a schematic of a conventional sigma-delta converter or modulator, also known as a delta-sigma, oversampling, or noise-shaping converter. These last two names are descriptive of the circuit's operation. That is, a comparator 170 is oversampled at a rate much higher than the Nyquist rate of the input signal received on line 105. Also, the low frequency noise floor is reduced, while the high frequency noise is increased, such that the noise spectrum is "shaped." The high frequency noise may be reduced by a low pass filter after the modulator.

Included are summing junctions 110 and 140, filters 130 and 160, digital-to-analog converters (DACs) 120 and 150, comparator 170, and optional delay and return-to-zero circuits 190 and 180. An input signal is received on line 105 by summing junction 110. An output of summing junction 110 is received by filter 130. Filter 130 is often a high-ordered filter, such as a fourth or sixth-order filter. An output of filter 130 is received by summing junction 140, which in turn drives a second filter 160. The construction of the second filter 160 may be similar to that of the first filter 130. The outputs of the second filter 160 drives the comparator 170, which provides an output on line 175. The comparator is clocked by a clocked signal received on clock line 172. This clock may be provided by a VCO, crystal, or other stable periodic source. The output of comparator 170 is applied to DACs 120 and 150, which in turn drive inverted inputs of summing junctions 110 and 140.

Several difficulties arise with this architecture. For example, if the comparator 170 is required to resolve a low level signal at its input, its output may become unstable. This metastability of the comparator output appears as jitter at the filter input, and thus reduces the converter's performance. Also, any DAC ringing, settling time, or clock feedthrough similarly degrades performance. Accordingly, some prior art circuits have included either or both a return-to-zero 180 or delay element 190, such that the comparator decision points are removed in time from these DAC transients. Unfortunately, these fixes have limited success and cause other problems. For example, the inclusion of delay element 190 may make the converter unstable.

These problems have limited the use of continuous time or analog circuits for filters 130 and 160. Many applications use discrete-time signal processing techniques including switched capacitor filters for these blocks. Due to the oversampling requirements of the sigma-delta architecture, the switched-capacitor filters must run at several MHz even for audio applications. This makes the design of these filters difficult, and has limited their use at higher bandwidth applications. Moreover, as technology progresses to deep submicron processes, switched capacitor filters are becoming increasingly difficult to implement.

What is needed are methods and circuits that allow the use of continuous time or analog filters in sigma-delta converters, while addressing the comparator metastability, DAC settling, and clock feedthrough problems of the prior art.

SUMMARY OF THE INVENTION

Accordingly, embodiments of the present invention provide methods and circuits for using continuous-time filters that address comparator metastability, DAC settling, and clock feedthrough problems in sigma-delta converters.

A comparator output is delayed while a switch at the input of a continuous-time integrator or filter is opened. A DAC is driven by the delayed comparator output, and after the DAC output settles, the switch is closed, and the integrator reacts to the new DAC input.

An exemplary embodiment of the present invention provides a method of converting an analog signal to a digital signal. The method includes receiving the analog signal at a summing junction, receiving a clock signal transitioning between a first level and a second level, connecting an output of the summing junction to an integrator when the clock signal is at the first level, and disconnecting the output of the summing junction from the integrator when the clock signal is at the second level. The method also includes providing an output signal that is determined by the polarity of an output of the integrator when the clock signal transitions from the first level to the second level, delaying the output signal, receiving the delayed output signal with a digital-to-analog converter, and receiving an output of the analog-to-digital converter with the summing junction.

Another exemplary embodiment of the present invention provides an integrated circuit having an analog-to-digital converter. The analog-to-digital converter includes a summing junction having a non-inverting input configured to receive an analog signal, a continuous-time integrator, and a switch configured to receive a clock signal. The switch is connected between an output of the summing junction and an input of the continuous-time integrator. The integrated circuit also includes a comparator having an input connected to an output of the integrator, a delay element having an input coupled to an output of the comparator, and a digital-to-analog converter having an input coupled to an output of the delay element and an output coupled to an inverting input of the summing junction.

A further exemplary embodiment of the present invention provides a method of converting an analog signal to a digital signal. The method includes receiving the analog signal with a first summing junction and receiving a clock signal. The clock signal transitions between a first level and a second level. The method also includes coupling an output of the first summing junction to an input of a first integrator when the clock signal is at the first level, disconnecting the output of the first summing junction from the input of the first integrator when the clock signal is at the second level, receiving an output of the first integrator with a second summing node, coupling an output of the second summing junction to an input of a second integrator when the clock signal is at the first level, and disconnecting the output of the second summing junction from the input of the second integrator when the clock signal is at the second level. An output signal that is determined by the polarity of an output of the second integrator is provided when the clock signal transitions from the first level to the second level. The method also includes delaying the output signal, receiving the delayed output signal with a first digital-to-analog converter and a second digital-to-analog converter, receiving an output of the first digital-to-analog converter with the first summing junction, and receiving an output of the second digital-to-analog converter with the second summing junction.

Yet a further exemplary embodiment of the present invention provides an integrated circuit. This integrated circuit has an analog-to-digital converter, the analog-to-digital converter including a first summing junction coupled to an input terminal, a first switch coupled between the summing junction and a first continuous-time integrator, a second summing junction coupled to the first continuous-time integrator, and a second switch coupled between the second summing junction and a second continuous-time integrator. A comparator is coupled to the second continuous-time integrator and an output terminal, a first digital-to-analog converter is coupled between the comparator and the first summing node, and a second digital-to-analog converter is coupled between the comparator and the second summing node.

Still another exemplary embodiment of the present invention provides a method of converting an analog signal to a digital signal using a sigma-delta converter. The converter includes a summing junction, a continuous-time integrator coupled to a comparator, and a digital-to-analog converter coupled to the summing junction. The method includes receiving a clock signal. The clock signal transitions between a first level and a second level. The method also includes coupling the continuous-time integrator to the summing junction when the clock is at the first level, and disconnecting the continuous time integrator from the summing junction when the clock is at the second level.

A further exemplary embodiment of the present invention provides a method of converting an analog signal to a digital signal using a sigma-delta converter. The converter includes a first summing junction, a first continuous-time integrator coupled to a second summing junction, a second continuous-time integrator coupled to a comparator, a first digital-to-analog converter coupled to the first summing junction, and a second digital-to-analog converter coupled to the second summing junction. The method includes receiving a clock signal, where the clock signal transitions between a first level and a second level, coupling the first continuous-time integrator to the first summing junction and the second continuous-time integrator to the second summing junction when the clock is at the first level, and disconnecting the first continuous-time integrator from the first summing junction and the second continuous-time integrator from the second summing junction when the clock is at the second level.

A better understanding of the nature and advantages of the present invention may be gained with reference to the following detailed description and the accompanying drawings.

DESCRIPTION OF EXEMPLARY EMBODIMENTS

Figure 1:
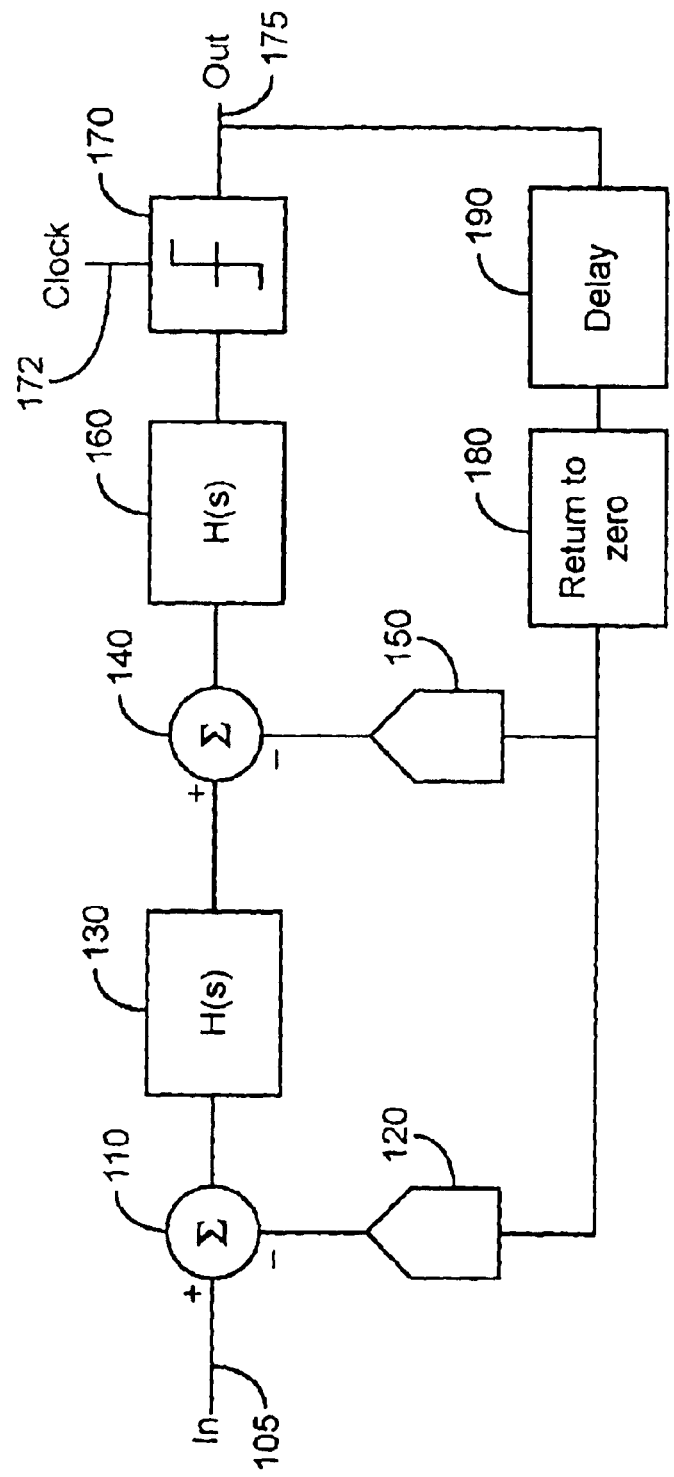
FIG. 1 is a schematic of a conventional sigma-delta converter.
Figure 2:
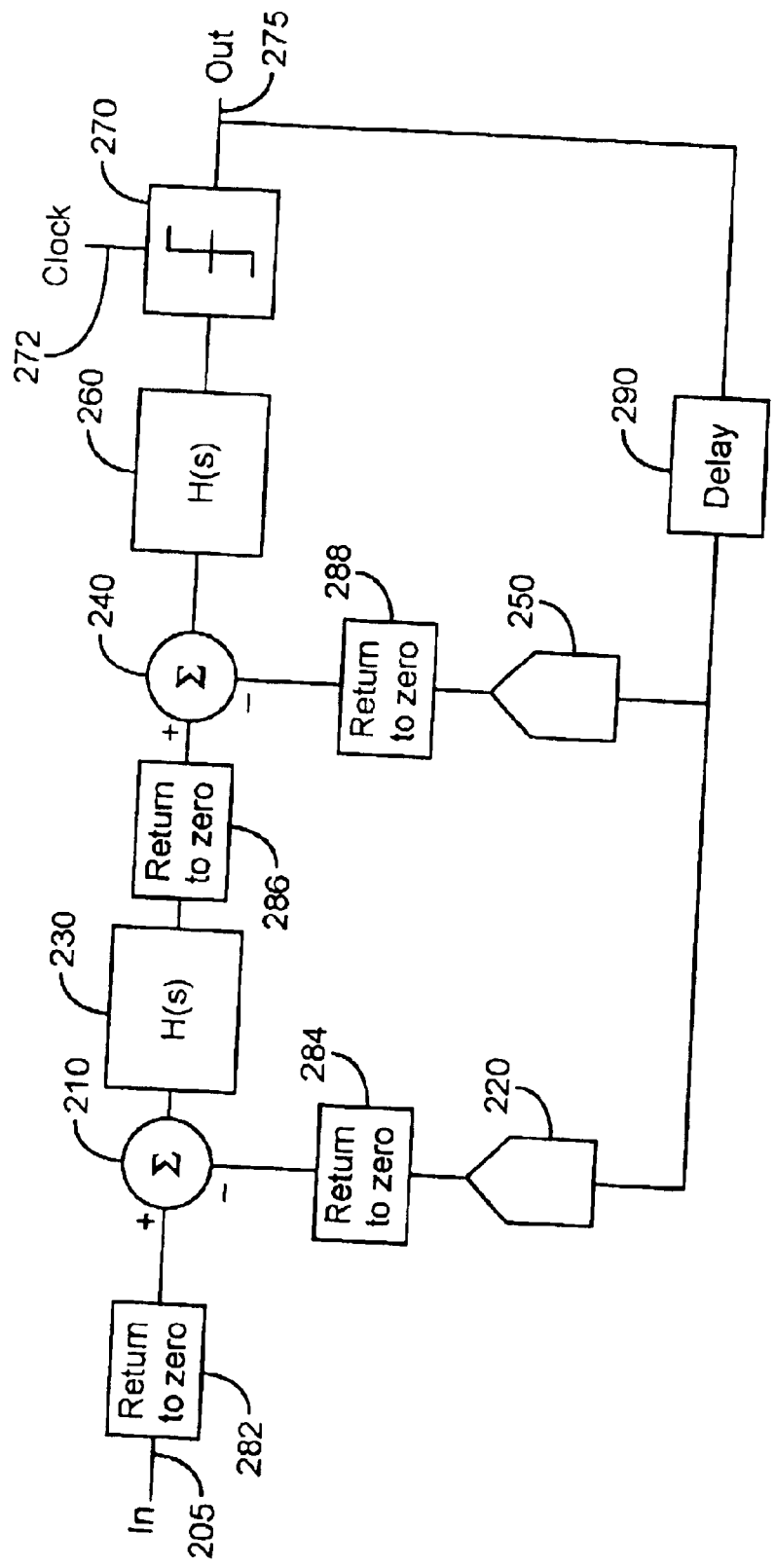
FIG. 2 illustrates a sigma-delta converter consistent with an embodiment of the present invention.

FIG. 2 illustrates a sigma-delta converter consistent with an embodiment of the present invention. A digital decimator, not shown, is typically connected to the output of the converter. This figure, and all the included figures, are shown for explanatory purposes only, and do not limit either the claims or the possible embodiments of the present invention.

Included are return-to-zero blocks 282, 284, 286, and 288, summing junctions 210 and 240, integrators or filters 230 and 260, DACs 220 and 250, comparator 270, and delay element 290. An input signal is received by return-to-zero block 282 on line 205. The output of return-to-zero block 282 is received by summing junction 210, which in turn drives integrator 230. The output of integrator 230 is connected to return-to-zero block 286 which drives an input of summing junction 240. The output of summing junction 240 is integrated by integrator 260, which provides an output to comparator 270. Comparator 270 is clocked by a clock signal received on line 272, and provides an output on line 275. The output of comparator 270 is delayed by delay element 290, which in turn drives DACs 220 and 250. The outputs of DACs 220 and 250 connect to return-to-zeros 284 and 288, which drive inverting inputs of the summing junction blocks 210 and 240.

In a specific embodiment of the present invention, each DAC 220 and 250 are a single-bit DAC, and the comparator 270 provides a single-bit output. In other embodiments, the DAC and comparator may be of a higher order. For example, four-bit DACs and a four-bit slice comparator may be used. A higher order DAC provides a smaller DAC output swing, which results in reduced DAC transients. The integrators 230 and 260 may be filters or current integrators.

A second-order converter or modulator is shown. Alternately, a first-order, third-order, or higher-order converter may be used. Higher order converters provide improved linearity as compared to lower order implementations. However, higher order converters are more difficult to stabilize.

Each return-to-zero block 282, 284, 286, and 288 receives a clock signal, not shown for simplicity. The clock signal may be the same clock signal received by comparator 270, or it may be another clock signal, though they are typically synchronized. When the clock signal is in a first state, for example low, the return-to-zero blocks provide zero current to the summing junctions 210 and 240. When the clock signal is in a second state, for example high, the return-to-zero blocks provide a current proportional to their input signal. For example, return-to-zero block 282 may pass the input current received on line 205 to the summing junction blocks 210 when the clock signal is high. Similarly, return-to-zero blocks 284 and 288 may pass the DAC output currents, and return-to-zero block 286 may pass a current that is proportional to the output signal of integrator 230.

In this way, while the DAC output currents are settling, they are not applied to the inverting points of summing junctions 210 and 240. Similarly, when DAC outputs are disconnected from the summing junctions, the other inputs to the summing junctions, specifically the input to the converter and the output of the first integrator 230, are also isolated. Delay element 290 is optional, but can be used to ensure that the DACs are isolated or disconnected from the summing junctions before the DAC inputs are switched.

A disadvantage of this architecture is that four return-to-zero blocks are required isolate, the inputs to summing junctions 210 and 240. A simplification can be made by recognizing that what is required is the protection of the integrators 230 and 260 from transient signals. Thus, it is possible to move the return-to-zero blocks to the other side of the summing junctions—the return-to-zero blocks can be "pushed through" the summing junctions to the inputs of the integrators. In this way, the four return-to-zero blocks are combined into two.

Figure 3:
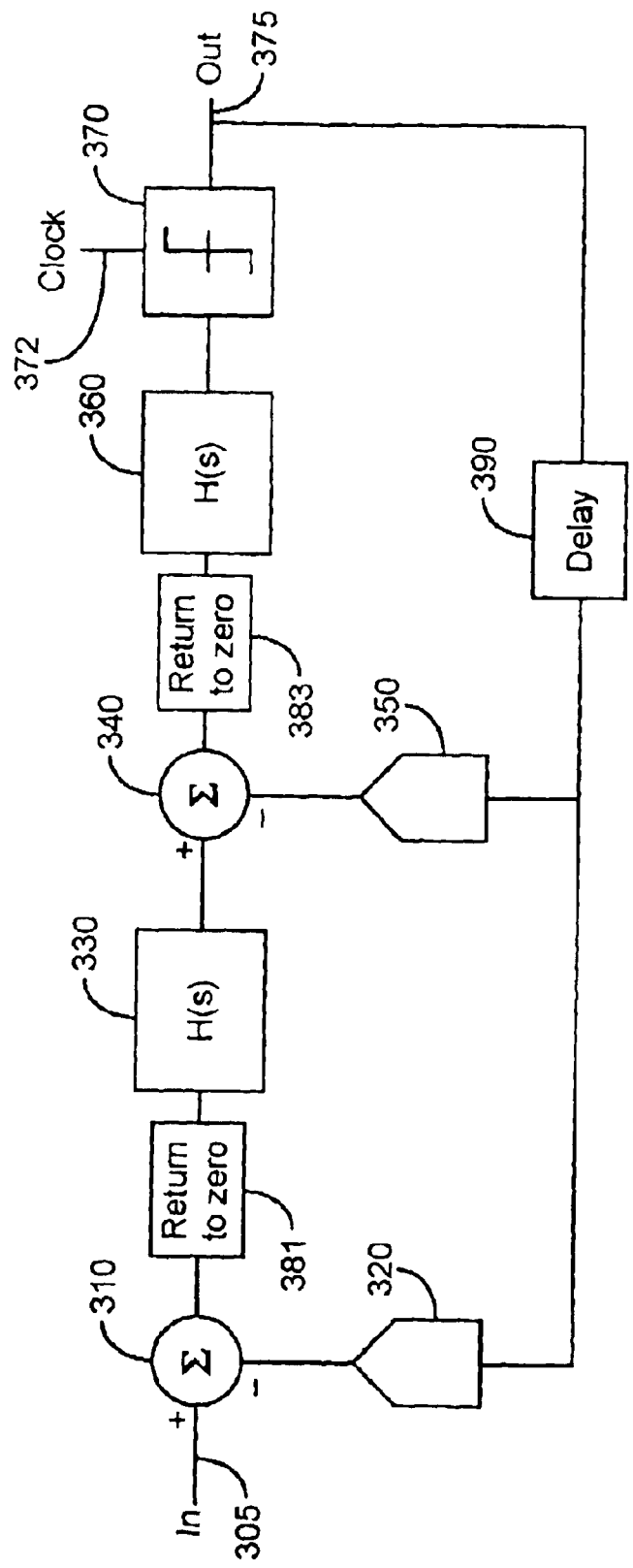
FIG. 3 is a block diagram of a sigma-delta converter consistent with an embodiment of the present invention that combines multiple return-to-zero blocks.

FIG. 3 is a block diagram of a sigma-delta converter consistent with an embodiment of the present invention that combines return-to-zero blocks in this way. Included are summing junctions 310 and 340, return-to-zero blocks 381 and 383, integrators 330 and 360, comparator 370, DACs 320 and 350, and delay element 390.

An input signal is received by summing junction 310 on line 305. An output of summing junction 310 is received by return-to-zero block 381, which in turn drives integrator 330. The output of integrator 330 drives an input of summing junction 340, the output of which is connected to return-to-zero block 383, which in turn drives integrator 360. The output of integrator 360 is connected to comparator 370, which provides an output signal on line 375. The comparator is clocked by a clocked signal received on line 372. The output of the comparator on line 375 is delayed by delay element 390, which in turn provides an input signal to DACs 320 and 350. The outputs of DACs 320 and 350 drive the inverting inputs of summing junctions 310 and 340.

Again, the return-to-zero blocks 381 and 383 receive a clocked signal, which is not shown for simplicity. This clock signal may be the same clock signal as the clock applied on line 372 to converter 370. Alternately, its may be another clock signal. If a different clock signal is used, it is likely synchronous with the comparator clock signal on line 372. Either or both clock signals may be generated by a VCO, crystal, or other stable periodic source. Either or both clock signals may be pulse signals, for example, a pulse signal generated using a one shot triggered by rising edges from a VCO.

The return-to-zero blocks 381 and 383 can be thought of as switches, or sample and hold (or track and hold) circuits that provide output currents which track an input when its clock is in a first state, and provides zero current, or a hold, when its clock is in a second state.

Figure 4:
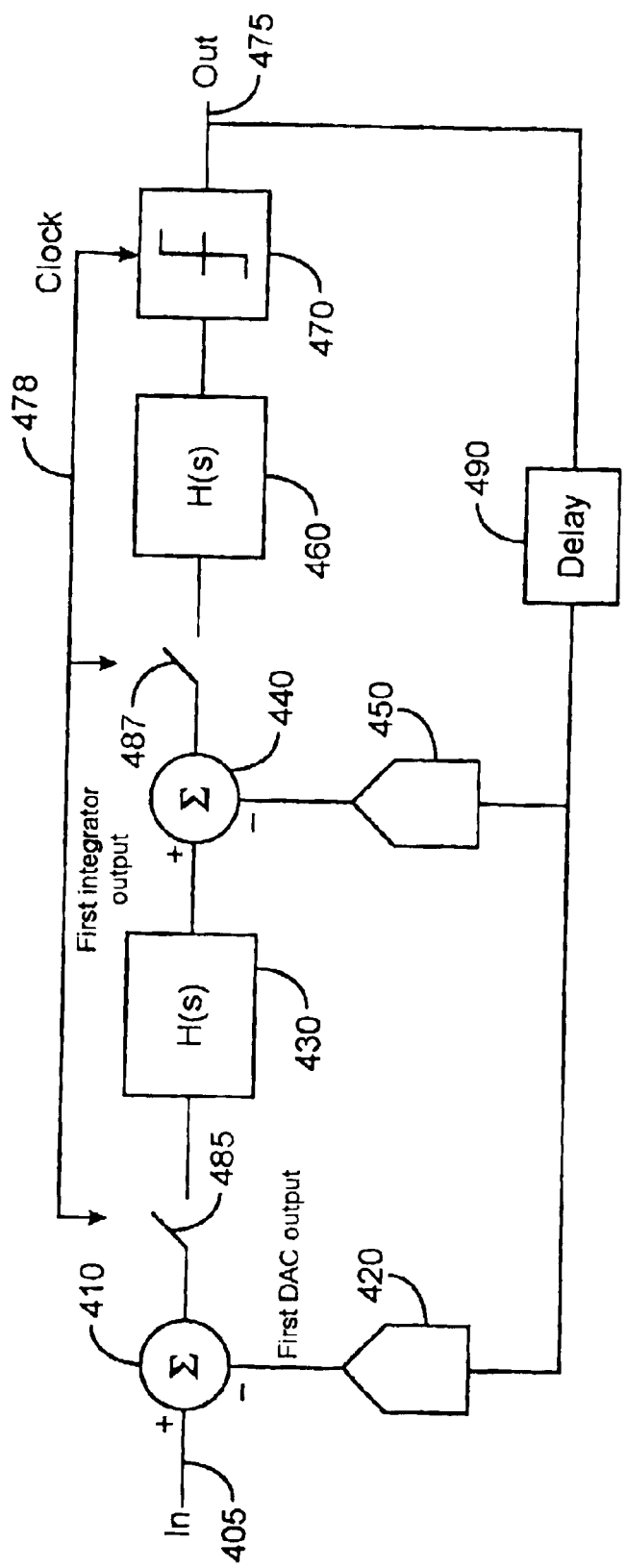
FIG. 4 illustrates a sigma-delta converter consistent with an embodiment of the present invention where return-to-zero blocks have been implemented as switches.

FIG. 4 illustrates a sigma-delta converter consistent with an embodiment of the present invention wherein the return-to-zero blocks have been implemented as switches. Included are summing junctions 410 and 440, integrators 430 and 460, comparator 470, delay element 490, and DACs 420 and 450. An input signal is received on line 405 by a non-inverting input of summing junction 410. The output of summing junction 410 drives to one terminal of switch 485. The other terminal of switch 485 is connected to the input of integrator 430, the output of which is connected to a non-inverting input of summing junction 440. The output of summing junction 440 drives to a terminal of switch 487, the other terminal of which connects to the input of integrator 460. Switches 485 and 487 are under control of a clock signal on line 478. The output of integrator 460 drives art input of comparator 470, which provides an output on line 475. The output of the comparator 470 connects to the delay element 490, which in turn drives the inputs of DACs 420 and 450. The output of DACs 420 and 450 connect to the inverting inputs of summing junctions 410 and 440.

Again, the clock signal may be generated by a VCO, crystal, or other stable periodic source. Alternately, it may be generated by a circuit, such as a "one shot," triggered by an edge of the clock. Such an architecture can provide a more consistent pulse width having less pulse jitter than using a VCO output directly, thus improving converter performance.

Also, the DACs and comparator may be one bit, or they may be multibit. For example, an embodiment uses two four-bit DACs and a four-bit slice comparator. The increase in bits improves DAC output settling time and jitter performance for the simple reason that a multibit DAC output (often) has a smaller output swing.

Specifically, since the DAC output switches at a much higher rate than the bandwidth of the input signal, when the DAC changes levels, it is by only one bit. For a one-bit change in a multibit DAC, the output swing is smaller, and the jitter and settling (or recovery) time is reduced.

In this example, a two stage converter or modulator is shown. In other embodiments, more stages are used. For example, a three stage converter may be used, wherein an additional stage including another summing node, DAC, switch, and integrator is added.

Figure 5:
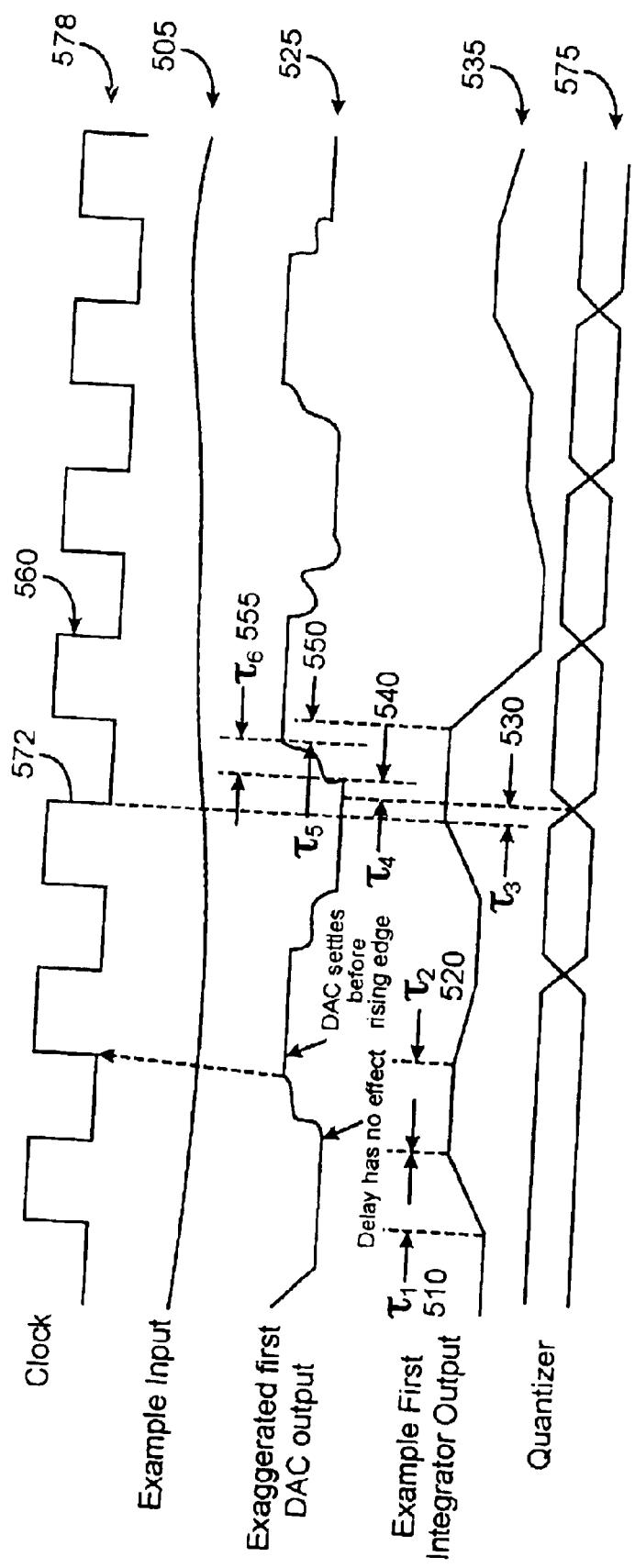
FIG. 5 is a timing diagram showing the timing of the operation of the sigma-delta converter of FIG. 4.

FIG. 5 is a timing diagram showing the timing of the operation of the sigma-delta converter of FIG. 4. The clock signal on line 478 is represented as trace 578. The input to the converter on line 405 is shown as trace 505. The comparator output on line 475 is shown as trace 575. Following a falling edge 572 of the clock signal 578, the comparator output 575 may change state. The delay from the clock falling edge to a change in the comparator's output is $t_3$ 530. After the comparator changes state, its output is delayed a time $t_4$ 540 by delay element 490, the output of which drives DACs 420 and 450. The output of the first DAC 420 is shown as trace 525. The clock feedthrough, output jitter, and settling time are exaggerated for explanatory purposes.

The DAC takes time $t_6$ 555 to settle, during which switches 485 and 487 are open. The DAC outputs are stable for a time $t_5$ 550 before switches 485 and 487 are closed, and the integrators are allowed to resume integrating. The output of the first integrator 430 is shown as trace 535. When the clock is high, the switches are closed and the integrator integrates. This is shown as time $t_1$ 510. When the clock input is low, the switches are open and the integrators retain their value during time $t_2$ 520.

In this way the outputs of the integrators are held constant while the DACs settle, and thus do not react to DAC transients. This improves converter performance, and enables continuous time or analog integrators to be used in the place of switch capacitor filters.

Figure 6:
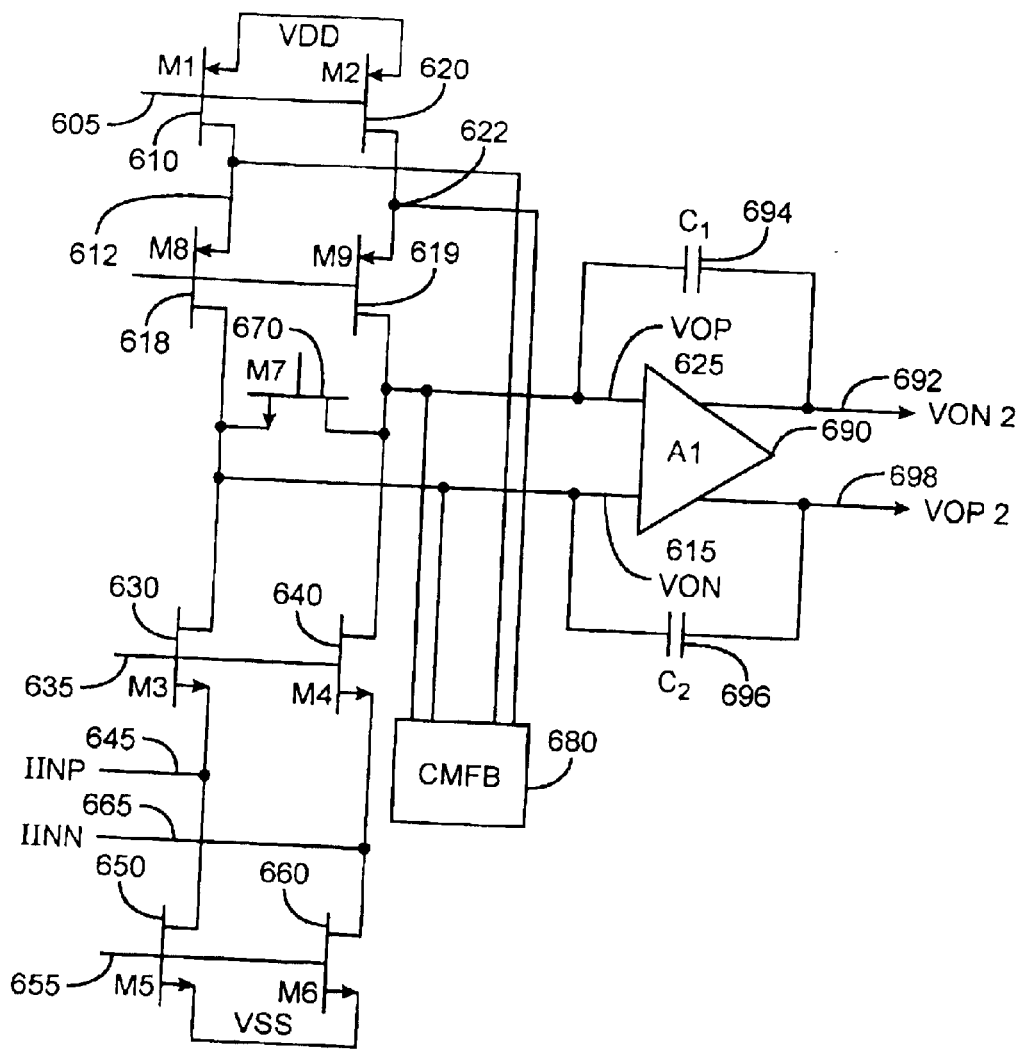
FIG. 6 is a simplified schematic of an integrator which may be used as an integrator in embodiments of the present invention.

FIG. 6 is a simplified schematic of an integrator which may be used as integrator 430 or 460, or other similar integrators in embodiments of the present invention. Included are current source transistors M1 610, M2 620, M5 650, and M6 660, cascode devices M8 618, M9 619, M3 630, and M4 640, switch M7 670, amplifier A1 690, capacitors C1 694 and C2 696, and common-mode feedback circuit

680. One skilled in the art appreciates that many changes may be made to this schematic without departing from the invention. For example, some or all the cascode device may be removed.

Current source devices M1 610 and M2 620 are biased by a voltage on line 605 and provide currents in their drains. Currents source devices M5 650 and M6 660 are biased by a voltage on line 655, and provide currents in their drains, which are less than the current provided by M1 610 and M2 620. Common-mode feedback circuit 680 senses the voltages at the inputs of the amplifier A1 690, and sinks currents from the drains of current sources M1 610 and M2 620, such that the common mode voltages at the inputs of the amplifier are properly set. Alternatively, the common-mode feedback circuit 680 may provide or source current. In that case, the bias currents sunk by M5 650 and M6 660 should be larger than those sourced by M1 610 and M2 620. Typically, in the absence of an input signal at IINP 645 and IINN 665, the input voltages of the amplifier are approximately equal and at a DC level where the cascode devices M8 618, M9 619, M3 630, and M4 640, as well as the devices in the input stage of the amplifier, are not operating in their triode region.

Cascode devices M3 630 and M4 640 provide a low impedance input for currents IINP on line 645 and IINN on line 665, and isolate current source transistors M5 650 and M6 660 from the transient voltages of signals VOP and VON on lines 625 and 615. Similarly, cascode devices M8 618 and M9 619 isolate current sources M1 610 and M2 620 from these voltages.

Input currents IINP and IINN are received on lines 645 and 665. These currents add to or subtract from the bias currents provided by current source devices M5 650 and M6 660. Typically, these input currents are differential, such that when one current has a magnitude and a polarity, the other current as the same magnitude but opposite polarity. Alternately, one current may be held at a DC level, above and below which the other current swings. The changes in input currents create an imbalance in the currents present at nodes VOP 625 and VON 615. This resulting differential current is provided by the output stage of amplifier A1 690, resulting in currents through capacitors C1 694 and C2 696. Since the amplifier A1 690 is configured such that the differential voltage at its input terminals VOP 625 and VON 615 remain at or near zero volts, the accumulation of charge across capacitors C1 694 and C2 696 caused by these currents create a differential voltage between nodes VOP2 694 and VON2 692.

Specifically, current flowing into node IINP 645 provides current for the drain of device M5 650, thus reducing current in the source of device M3 630. This means that some of the current provided by current source device M1 610 flows into capacitor C2 696 from node VON 615 to node VOP2 694. Since the amplifier A1 690 is configured to maintain the voltage at VON 615, the current through capacitor C2 696 decreases the voltage at VOP2 on line 694. Conversely, current flowing out of the IINP input line 645 flows through device M3 630. This current is supplied by the output stage of amplifier A1 690, through capacitor C2 696 from node VOP2 694 to node VON 615. Accordingly, capacitor C2 696 charges, and since VON 615 remains constant because of the amplifier A1 690, its other terminal VOP2 694 increases in voltages.

Signal currents IINP and IINN flow in to and out of nodes 645 and 665 when the return-to-zero circuits or switches, such as switches 485 and 487 in FIG. 4, are closed. When switches 485 and 487 are open, these currents may be diverted to an AC ground, such as the dummy load in the following figure.

Switch M7 670 in this figure should not be confused with switches 485 and 487 in FIG. 4. Switch M7 670 closes such that amplifier input nodes VOP 625 and VON 615 are shorted when switches 485 and 487 are open. Closing switch M7 670 at this time keeps the output nodes VOP 692 and VON 694 from drifting in the absence of input currents.

The active devices are shown as CMOS devices. In other embodiments other types of devices, such as bipolar, BiCMOS, HEMT, pHEMT, HBTs, MESFETs, or other types of devices may be used.

Figure 7A:
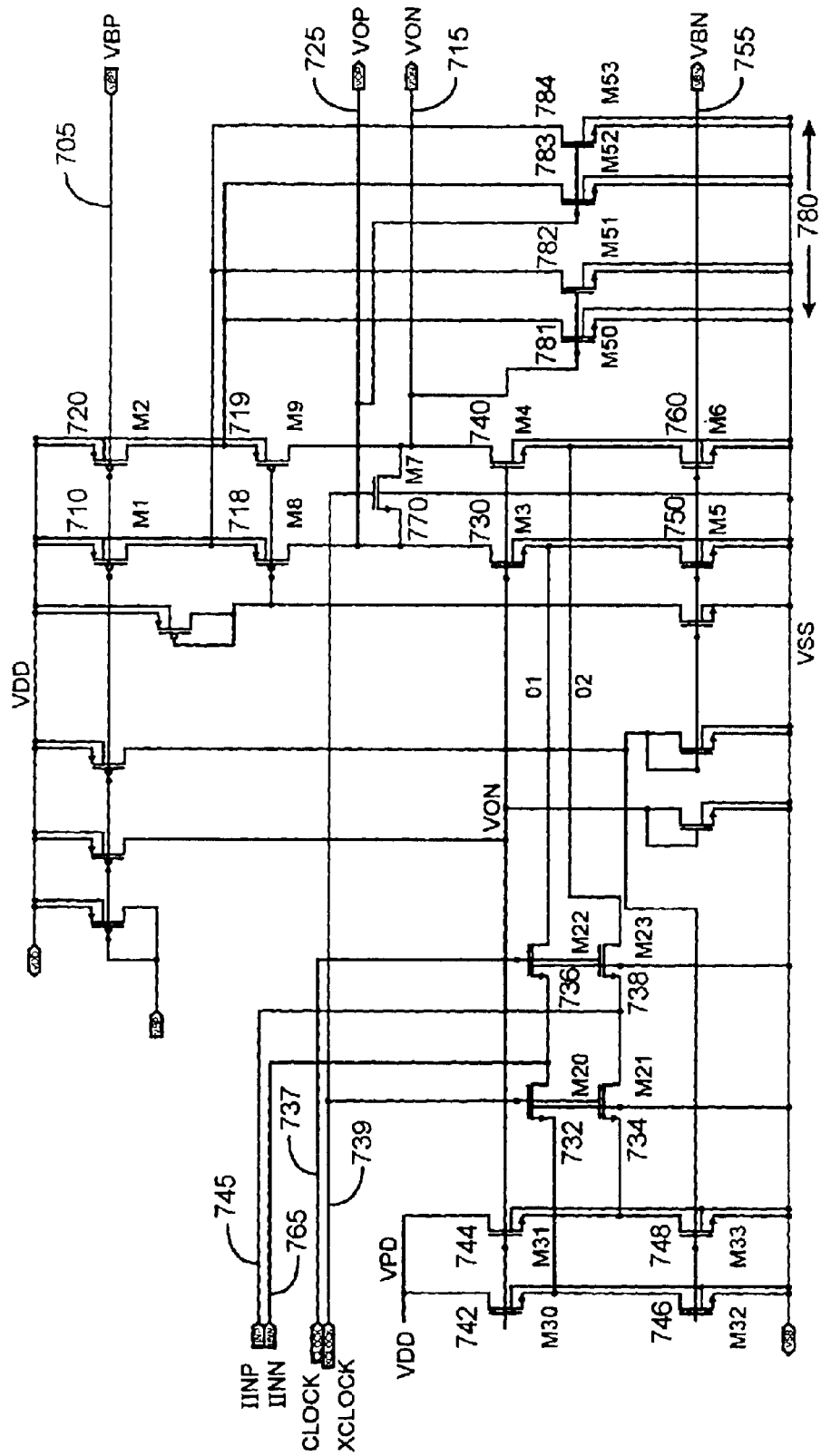
FIGS. 7A and 7B are a more detailed schematic of an integrator which may be used as an integrator in embodiments of the present invention.
Figure 7B:
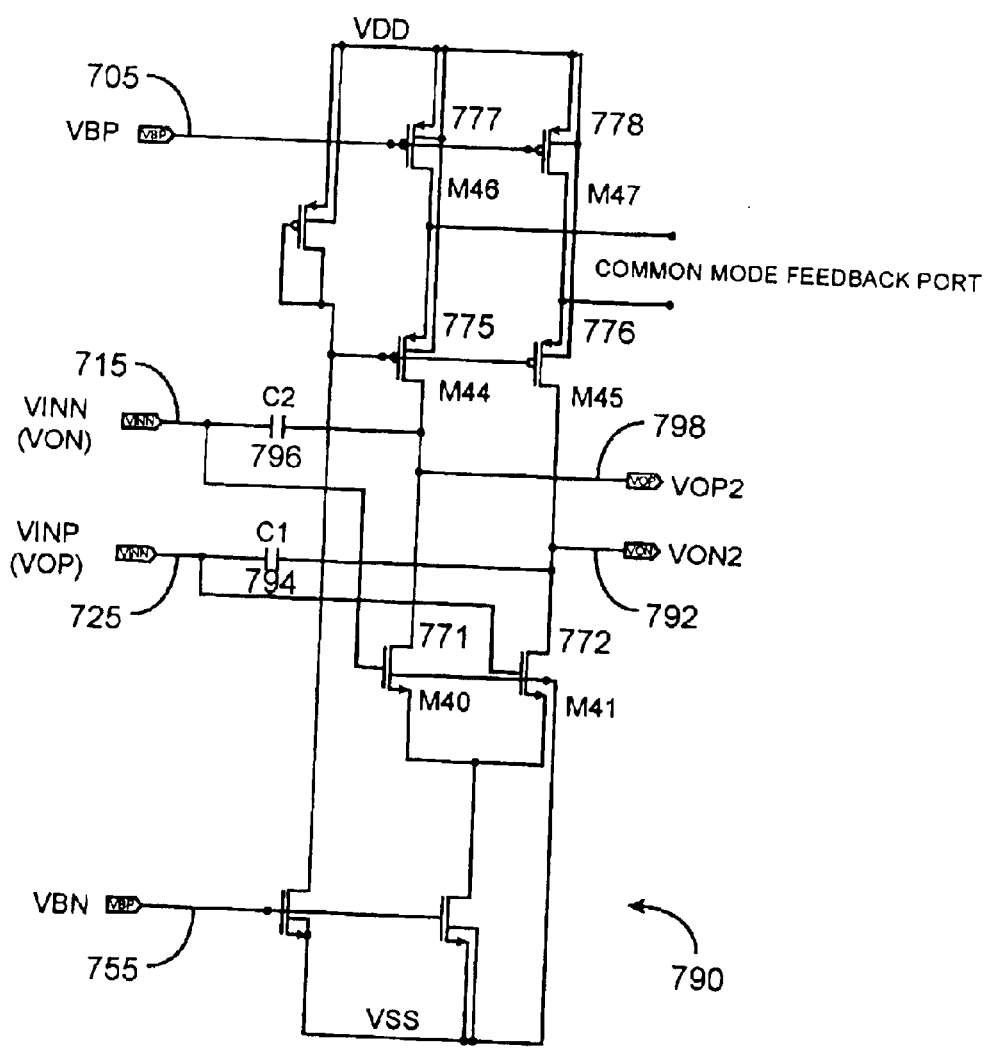

FIGS. 7A and 7B are a more detailed schematic of an integrator consistent with the present invention that may be used as integrator 430 or 460 in FIG. 4, or other integrators in other embodiments of the present invention. The input switches, such as switches 485 and 487, are included. The other major blocks shown include a dummy input stage, current input stage, common-mode feedback circuit, an amplifier having a cascoded input differential pair with cascoded current source loads, and feedback capacitors.

In FIG. 7A, devices M20 732, M21 734, M22 736, and M23 738 form a differential input switch that may be used as switches 485 and 487, or other switch is in other embodiments of the present invention. When the switch is closed, that is the CLOCK signal on line 737 is high, devices M22 736 and M23 738 short the input terminals 745 and 765 to the current input stage. When the input switch is open, that is the CLOCK signal on line 737 is low, devices M20 732 and M21 730 short the input nodes 745 and 765 to a dummy input stage or load formed by devices M30 742, M31 744, M32 746, and M33 748. In a specific embodiment, these switches are biased close to ground to ensure proper switching. This becomes of particular concern in newer, small-geometry processes. The signal XCLOCK on line 739 is typically the complement of the CLOCK signal on line 737, though they may be overlapping, non-overlapping, or other signals. For example, one signal may be at a DC level, while the other swings above and below that DC level.

As before, devices M1 710, M2 720, M5 750, and M6 760 form current sources which are isolated from nodes VOP 725 and VON 715 by cascode devices M8 718, M9 719, M3 730, and M4 740. The input currents applied to the sources of M3 730 and M4 740 appear as currents at the outputs VOP 725 and VON 715, and flow through capacitors C1 794 and C2 796 (FIG. 7B).

Devices M50 781, M51 782, M52 783, and M53 784 form the common-mode feedback circuit 780. As the nodes VOP 725 and VON 715 increase in voltage, the common-mode feedback devices conduct more current. This diverts current away from the sources of M8 718 and M9 719, which reduces the voltages at nodes VOP 725 and VON 715. As a result, the input of the amplifier remains properly biased.

FIG. 7B is a schematic of the amplifier A1. Amplifier A1 790 is formed by differential pair M40 771 and M41 772. This differential pair may optionally be cascoded. An active load formed by current sources M46 777 and M47 778 is cascoded by devices M44 775 and M45 776. This arrangement provides a high-gain, high-speed, low-offset amplifier.

Switch M7 770 (FIG. 7A) closes, thus shorting, or forming a low impendence between nodes VOP 725 and VON 715 when switches M22 736 and M23 738 are open. Again, this prevents the inputs to the amplifier from drifting in the absence of an input signal.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of converting an analog signal to a digital signal comprising:
   receiving the analog signal at a summing junction;
   receiving a clock signal transitioning between a first level and a second level;
   coupling an output of the summing junction to an input of an integrator when the clock signal is at the first level;
   disconnecting the output of the summing junction from the input of the integrator when the clock signal is at the second level;
   providing an output signal that is determined by the polarity of an output of the integrator when the clock signal transitions from the first level to the second level;
   delaying the output signal;
   receiving the delayed output signal with a digital-to-analog converter; and
   providing an output of the digital-to-analog converter directly to the summing junction.

2. A method of converting an analog signal to a digital signal comprising:
   receiving the analog signal at a summing junction;
   receiving a clock signal transitioning between a first level and a second level;
   coupling an output of the summing junction to an input of an integrator when the clock signal is at the first level;
   disconnecting the output of the summing junction from the input of the integrator when the clock signal is at the second level;
   providing an output signal that is determined by the polarity of an output of the integrator when the clock signal transitions from the first level to the second level;
   delaying the output signal;
   receiving the delayed output signal with a digital-to-analog converter, and receiving an output of the digital-to-analog converter with the summing junction,
   wherein the input of the integrator is a differential input comprising a first node and a second node, and the first node and the second node are connected through a low impedance when the clock is at the second level.

3. The method of claim 2 wherein the low impedance is a CMOS device.

4. A method of converting an analog signal to a digital signal comprising:
   receiving the analog signal with a first summing junction;
   receiving a clock signal, the clock signal transitioning between a first level and a second level;
   coupling an output of the first summing junction to an input of a first integrator when the clock signal is at the first level;
   disconnecting the output of the first summing junction from the input of the first integrator when the clock signal is at the second level;
   receiving a directly coupled output of the first integrator with a second summing node;
   coupling an output of the second summing junction to an input of a second integrator when the clock signal is at the first level;
   disconnecting the output of the second summing junction from the input of the second integrator when the clock signal is at the second level;
   providing a comparator output signal that is determined by an output of the second integrator when the clock signal transitions from the first level to the second level;
   delaying the comparator output signal;
   receiving the delayed comparator output signal with a first digital-to-analog converter and a second digital-to-analog converter,
   receiving an output of the first digital-to-analog converter with the first summing junction; and
   receiving an output of the second digital-to-analog converter with the second summing junction.

5. The method of claim 4 wherein the analog signal is received at a non-inverting node of the first summing junction.

6. The method of claim 4 wherein the clock signal is generated by a pulse generator.

7. The method of claim 4 wherein the clock signal is generated by a voltage controlled oscillator.

8. The method of claim 4 wherein the comparator and first and second digital-to-analog converters have one bit of resolution.

9. The method of claim 4 wherein the comparator and first and second digital-to-analog converters have four bits of resolution.

10. A method of converting an analog signal to a digital signal comprising:
    receiving the analog signal with a first summing junction;
    receiving a clock signal, the clock signal transitioning between a first level and a second level;
    coupling an output of the first summing junction to an input of a first integrator when the clock signal is at the first level;
    disconnecting the output of the first summing junction from the input of the first integrator when the clock signal is at the second level;
    receiving an output of the first integrator with a second summing node;
    coupling an output of the second summing junction to an input of a second integrator when the clock signal is at the first level;
    disconnecting the output of the second summing junction from the input of the second integrator when the clock signal is at the second level;
    providing a comparator output signal that is determined by an output of the second integrator when the clock signal transitions from the first level to the second level;
    delaying the comparator output signal;
    receiving the delayed comparator output signal with a first digital-to-analog converter and a second digital-to-analog converter;
    receiving an output of the first digital-to-analog converter with the first summing junction; and
    receiving an output of the second digital-to-analog converter with the second summing junction;

wherein the input of the first integrator is a differential input comprising a first node and a second node, and the first node and the second node are connected through a low impedance when the clock is at the second level.

11. An integrated circuit comprising an analog-to-digital converter, the analog-to-digital converter comprising:
a summing junction having a non-inverting input, an inverting input, and an output, the non-inverting input configured to receive an analog signal;
a continuous-time integrator having an input and an output;
a first switch configured to receive a clock signal, coupled between the output of the summing junction and the input of the continuous-time integrator;
a comparator having an output and an input coupled to the output of the integrator;
a delay element having an input coupled to the output of the comparator and an output; and
a digital-to-analog converter having an input coupled to the output of the delay element and an output directly coupled to the inverting input of the summing junction.

12. The integrated circuit of claim 11 wherein the input of the continuous-time integrator is a differential input including a first node and a second node, and further comprising:
a second switch configured to receive the clock signal and coupled between the first node and the second node.

13. The integrated circuit of claim 12 wherein when the first switch is closed, the second switch is open, and when the first switch is open, the second switch is closed.

14. An integrated circuit comprising an analog-to-digital converter, the analog-to-digital converter comprising:
a first summing junction coupled to an input terminal,
a first switch coupled between the summing junction and a first continuous-time integrator;
a second summing junction directly coupled to the first continuous-time integrator;
a second switch coupled between the second summing junction and a second continuous-time integrator;
a comparator coupled to the second continuous-time integrator and an output terminal;
a first digital-to-analog converter coupled between the comparator and the first summing node; and
a second digital-to-analog converter coupled between the comparator and the second summing node.

15. The integrated circuit of claim 14 further comprising:
a delay element coupled between the comparator and the first and second digital-to-analog converters.

16. The integrated circuit of claim 14 wherein the comparator and first and second digital-to-analog converters have one bit of resolution.

17. The integrated circuit of claim 14 wherein the comparator and first and second digital-to-analog converters have four bits of resolution.

18. An integrated circuit comprising an analog-to-digital converter, the analog-to-digital converter comprising:
a first summing junction coupled to an input terminal;
a first switch coupled between the summing junction and a first continuous-time integrator;
a second summing junction coupled to the first continuous-time integrator;
a second switch coupled between the second summing junction and a second continuous-time integrator;
a comparator coupled to the second continuous-time integrator and an output terminal;
a first digital-to-analog converter coupled between the comparator and the first summing node; and
a second digital-to-analog converter coupled between the comparator and the second summing node,
wherein the input of the first continuous-time integrator is differential and the input of the second continuous-time integrator is differential, and further comprising:
a third switch coupled between the differential inputs of the first continuous-time integrator; and
a fourth switch coupled between the differential inputs of the second continuous-time integrator.

19. The integrated circuit of claim 18 wherein the first and second switches are configured to receive a first clock signal, the third and fourth switches are configured to receive a second clock signal, and when the first and second switches are open, the third and fourth switches are closed.

20. The integrated circuit of claim 19 wherein the first and second clock signals form a differential clock signal.

21. The integrated circuit of claim 18 wherein when the first and second switches are open, the third and fourth switches are closed, and when the first and second switches are closed, the third and fourth switches are open.

22. The integrated circuit of claim 21 wherein the first, second, third, and fourth switches are open and closed by one or more signals generated by a pulse generator.

23. A method of converting an analog signal to a digital signal using a sigma-delta converter comprising a summing junction, a continuous-time integrator directly coupled to a comparator, and a digital-to-analog converter coupled to the summing junction, the method comprising:
receiving a clock signal, the clock signal transitioning between a first level and a second level;
coupling the continuous-time integrator to the summing junction when the clock is at the first level; and
disconnecting the continuous time integrator from the summing junction when the clock is at the second level.

24. The method of claim 23 further comprising:
providing an output of the comparator based on the polarity of an output of the continuous-time integrator when the clock signal transitions from the first level to the second level.

25. The method of claim 24 further comprising:
delaying the output of the comparator; and
providing the delayed comparator output to the digital-to-analog converter.

26. A method of converting an analog signal to a digital signal using a sigma-delta converter comprising a summing junction, a continuous-time integrator coupled to a comparator, and a digital-to-analog converter coupled to the summing junction, the method comprising:
receiving a clock signal, the clock signal transitioning between a first level and second level;
coupling the continuous-time integrator to the summing junction when the clock is at the first level;
disconnecting the continuous time integrator from the summing junction when the clock is at the second level;
providing an output of the comparator based on the polarity of an output of the continuous-time integrator when the clock signal transitions from the first level to the second level;
delaying the output of the comparator;
providing the delayed comparator output to the digital-to-analog converter; and
coupling a first side of a differential input of the continuous-time integrator to a second side of a differential input of the continuous-time integrator when the clock is at the second level.

27. A method of converting an analog signal to a digital signal using a sigma-delta converter comprising a first summing junction, a first continuous-time integrator directly coupled to a second summing junction, a second continuous-time integrator directly coupled to a comparator, a first digital-to-analog converter directly coupled to the first summing junction, and a second digital-to-analog converter directly coupled to the second summing junction, the method comprising:

receiving a clock signal, the clock signal transitioning between a first level and a second level;

coupling the first continuous-time integrator to the first summing junction and the second continuous-time integrator to the second summing junction when the clock is at the first level; and disconnecting the first continuous-time integrator from the first summing junction and the second continuous-time integrator from the second summing junction when the clock is at the second level.

28. The method of claim 27 further comprising:

providing an output of the comparator based on the polarity of an output of the continuous-time integrator when the clock signal transitions from the first level to the second level.

29. The method of claim 28 further comprising:

delaying the output of the comparator, and providing the delayed comparator output to the first and second digital-to-analog converters.

30. The integrated circuit of claim 27 wherein the comparator and the first and second digital-to-analog converters have one bit of resolution.

31. The integrated circuit of claim 27 wherein the comparator and the first and second digital-to-analog converters have four bits of resolution.

32. A method of converting an analog signal to a digital signal using a sigma-delta converter comprising a first summing junction, a first continuous-time integrator coupled to a second summing junction, a second continuous-time integrator coupled to a comparator, a first digital-to-analog converter coupled to the first summing junction, and a second digital-to-analog converter coupled to the second summing junction, the method comprising:

receiving a clock signal, the clock signal transitioning between a first level and a second level;

coupling the first continuous-time integrator to the first summing junction and the second continuous-time integrator to the second summing junction when the clock is at the first level;

disconnecting the first continuous-time integrator from the first summing junction and the second continuous-time integrator from the second summing junction when the clock is at the second level;

providing an output of the comparator based on the polarity of an output of the continuous-time integrator when the clock signal transitions from the first level to the second level;

delaying the output of the comparator;

providing the delayed comparator output to the first and second digital-to-analog converters; and coupling a first side of a differential input of the first continuous-time integrator to a second side of a differential input of the fist continuous-time integrator and a first side of a differential input of the second continuous-time integrator to a second side of a differential input of the second continuous-time integrator when the clock is at the second level.

* * * * *